United States Patent
Choi et al.

(10) Patent No.: US 9,336,904 B2
(45) Date of Patent: May 10, 2016

(54) SEMICONDUCTOR APPARATUS (71) Applicant: SK hynix Inc., Icheon-si, Gyeonggi-do (KR)

(72) Inventors: Won Jun Choi, Icheon-si (KR); Hyo Jin Baek, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 47 days.

(21) Appl. No.: 14/100,723

(22) Filed: Dec. 9, 2013

(65) Prior Publication Data

US 2015/0063053 A1 Mar. 5, 2015

(30) Foreign Application Priority Data

Aug. 30, 2013 (KR) ........................ 10-2013-0103771

(51) Int. Cl.
G11C 8/12 (2006.01)
G11C 29/24 (2006.01)
G11C 5/02 (2006.01)
G11C 29/12 (2006.01)

(52) U.S. Cl.
CPC ................ G11C 29/24 (2013.01); G11C 5/025 (2013.01); *G11C 2029/1206* (2013.01)

(58) Field of Classification Search
CPC ................................... G11C 29/08; G11C 8/12
USPC ..................... 365/230, 230.03, 201
See application file for complete search history.

(56) References Cited

U.S. PATENT DOCUMENTS

| 5,214,604 | A  | * | 5/1993  | Kato ........................... 365/185.2 |
| 5,341,049 | A  | * | 8/1994  | Shimizu et al. ................ 326/101 |
| 5,438,681 | A  | * | 8/1995  | Mensch, Jr. ................ G06F 1/08 716/110 |
| 6,801,870 | B2 | * | 10/2004 | Corr .................... G01R 31/3016 324/750.3 |
| 6,819,619 | B2 | * | 11/2004 | Morishita .............. G11C 5/145 365/189.09 |
| 6,928,596 | B2 | * | 8/2005  | Kimura ................... G11C 29/48 365/51 |
| 7,725,787 | B1 | * | 5/2010  | Wells ............. G01R 31/318519 714/725 |
| 2003/0212975 | A1 | * | 11/2003 | Frerichs .............. G06F 17/5068 716/114 |
| 2010/0014030 | A1 | * | 1/2010  | Lin ........................ G02F 1/1345 349/84 |
| 2010/0078635 | A1 | * | 4/2010  | Kuroda .................... G11C 5/02 257/48 |
| 2012/0069638 | A1 | * | 3/2012  | Matsuda et al. .............. 365/158 |
| 2012/0081942 | A1 | * | 4/2012  | Kurjanowicz .......... G11C 29/24 365/94 |

FOREIGN PATENT DOCUMENTS

KR  1020030012980 A  2/2003
KR  1020070101075 A  10/2007

* cited by examiner

*Primary Examiner* — Michael Tran
(74) *Attorney, Agent, or Firm* — William Park & Associates Ltd.

(57) ABSTRACT

A semiconductor apparatus includes a plurality of memory blocks including a plurality of unit memory blocks, respectively, a first area extending in a first direction among areas formed among the plurality of memory blocks, a second area extending in a second direction among the areas formed among the plurality of memory blocks, and a test mode-related circuit block arranged at an edge part of the first area.

20 Claims, 5 Drawing Sheets

SEMICONDUCTOR APPARATUS

CROSS-REFERENCE TO RELATED APPLICATION

The present application claims priority under 35 U.S.C. §119(a) to Korean application number 10-2013-0103771, filed on Aug. 30, 2013, in the Korean Intellectual Property Office, which is incorporated herein by reference in its entirety as set forth in full.

BACKGROUND

1. Technical Field

Various embodiments relate to a semiconductor apparatus, and more particularly, to an efficient layout technology of a semiconductor apparatus.

2. Related Art

In a semiconductor apparatus, a memory area, and various circuit configurations and signal lines are arranged to input/output data to/from the memory area.

Efficiently arranging the aforementioned circuit configurations and signal lines in a limited area may be very difficult in the design of the semiconductor apparatus.

Particularly, because a graphic memory requires relatively many signal lines in terms of product characteristics as compared with a main memory, it is typically necessary to arrange more signal lines in the same space of graphic memory as are arranged in main memory.

SUMMARY

A semiconductor apparatus capable of efficiently arranging various circuit configurations and signal lines related to data input/output of a memory area is described herein.

In one embodiment, a semiconductor apparatus includes: a plurality of memory blocks including a plurality of unit memory blocks, respectively; a first area extending in a first direction among areas formed among the plurality of memory blocks; a second area extending in a second direction among the areas formed among the plurality of memory blocks; and a test mode-related circuit block arranged at an edge part of the first area.

In another embodiment, a semiconductor apparatus includes: a first memory bank; a second memory bank; and an intersection area arranged between the first memory bank and the second memory bank, wherein a test mode-related circuit block is arranged at an edge part of a first area extending in a first direction among areas formed among a plurality of memory blocks of the first memory bank.

The present technology is able to efficiently arrange various circuit configurations and signal lines related to data input/output by utilizing a spare space.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present disclosure will be described in detail with reference to the accompanying drawings through example embodiments.

Figure 1:
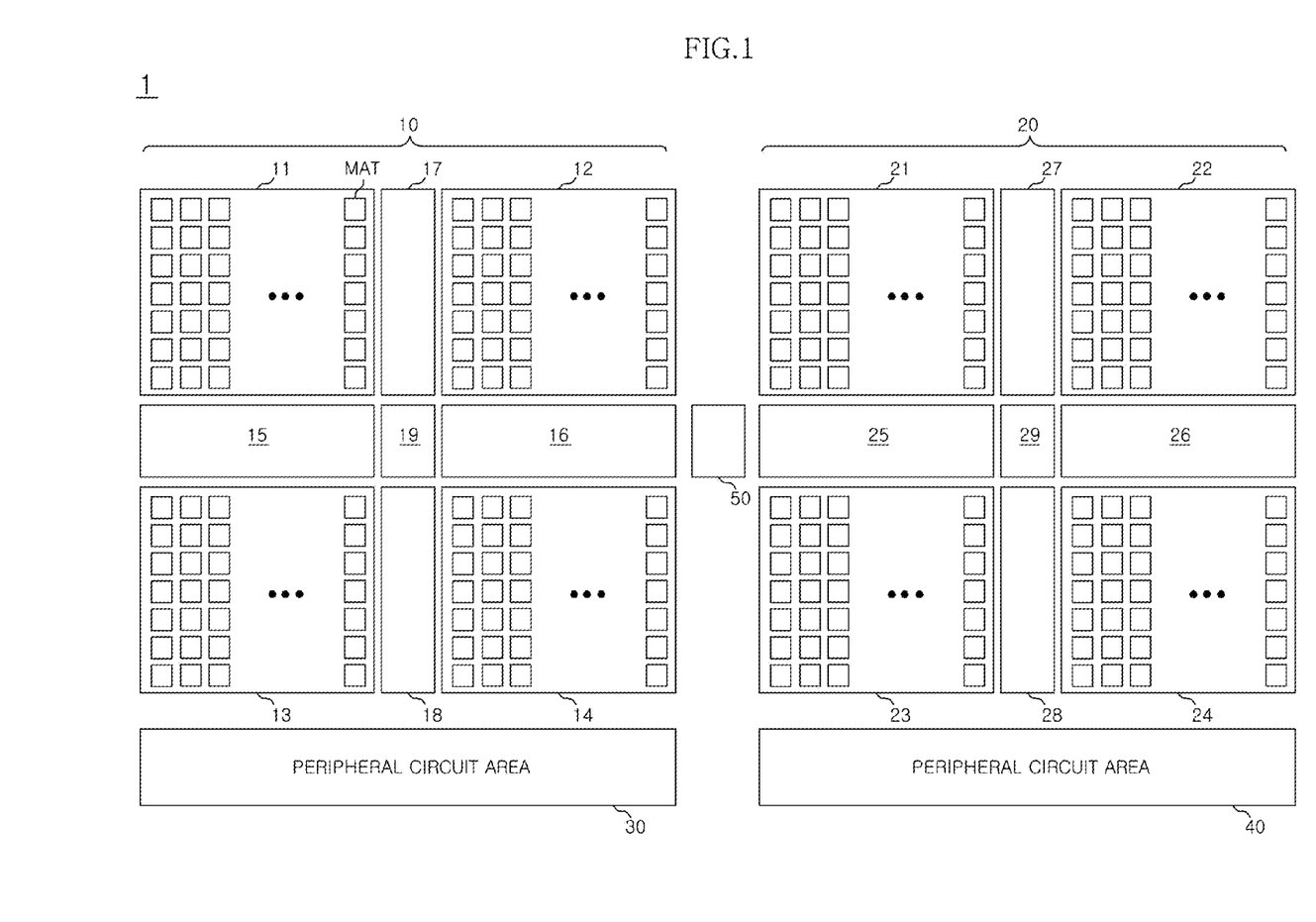
FIG. 1 is a layout diagram of a semiconductor apparatus 1 according to an embodiment.

Turning now to FIG. 1, which shows a plan view of a semiconductor apparatus 1. As illustrated in FIG. 1, in the semiconductor apparatus 1 according to an embodiment, peripheral circuit areas 30 and 40 are respectively arranged with respect to a first memory bank 10 and a second memory bank 20.

An intersection area 50 is arranged between the first memory bank 10 and the second memory bank 20. In one example, the intersection area 50 is not included in the first memory bank 10 or the second memory bank 20.

The first memory bank 10 may include a plurality of memory blocks 11 to 14, first areas 15 and 16, second areas 17 and 18, and a third area 19. The memory blocks 11 to 14 may comprise a first memory block 11, a second memory block 12, a third memory block 13 and a fourth memory block 14.

Each of the plurality of memory blocks 11 to 14 may include a plurality of unit memory blocks, that is, a plurality of mats MAT.

The first areas 15 and 16 may be areas extending in a first direction (for example, a horizontal direction) among areas formed among the plurality of memory blocks 11 to 14. The first areas 15 and 16 may be disposed along a first axis which may substantially bisect the third area 19 and the first areas 15 and 16. Further, the first area 15 may be disposed on a second axis which substantially bisects the first area 15 and first and third memory blocks 11 and 13. Also, the first area 16 may be disposed on a third axis which substantially bisects the first area 16 and the second and fourth memory blocks 12 and 14. The second and third axis may be substantially parallel. The second and third axis may be substantially perpendicular to the first axis.

In the first areas 15 and 16, signal lines for column control may be arranged.

The second areas 17 and 18 may be areas extending in a second direction (for example, a vertical direction) among the areas formed among the plurality of memory blocks 11 to 14. The second areas 17 and 18 may be disposed on a fourth axis. The fourth axis may substantially bisect the third area 19 and the second areas 17 and 18. The fourth axis may be substantially perpendicular to the first axis.

In the second areas 17 and 18, circuit configurations related to a column decoding operation and column control may be arranged.

The third area 19 may be an area where the first areas 15 and 16 intersect with the second areas 17 and 18. In other words, the first and fourth axis may intersect in the third area 19. Further, the first areas 15 and 16 and the second areas 17 and 18 may extend in a direction such that the first areas 15 and 16 and the second areas 17 and 18 meet and/or intersect in the third area 19. Still further, the third area 19 may be disposed such that two sides of the third area 19 may be substantially aligned with two sides of the second areas 17 and 18. Also, two sides of the third area 19 may be substantially aligned with two sides of the first areas 15 and 16.

In the third area 19, circuit configurations related to operation timing control of sense amplifiers included in the plurality of memory blocks 11 to 14 may be arranged.

The second memory bank 20 may include a plurality of memory blocks 21 to 24, first areas 25 and 26, second areas 27 and 28, and a third area 29. The memory blocks 21 to 24 may comprise a first memory block 21, a second memory block 22, a third memory block 23 and a fourth memory block 24.

Each of the plurality of memory blocks 21 to 24 may include a plurality of unit memory blocks, that is, a plurality of mats MAT.

The first areas 25 and 26 may be areas extending in the first direction (for example, the horizontal direction) among areas formed among the plurality of memory blocks 21 to 24. The first areas 25 and 26 may be disposed along the first axis which may substantially bisect the third area 29 and the first areas 25 and 26. Further, the first area 25 may be disposed along a fifth axis which substantially bisects the first area 25 and the first and third memory blocks 21 and 23. Also, the first area 26 may be disposed on a sixth axis which substantially bisects the first area 26 and the second and fourth memory blocks 22 and 24. The fifth and sixth axis may be substantially parallel. The fifth and sixth axis may be substantially perpendicular to the first axis.

In the first areas 25 and 26, signal lines for column control may be arranged.

The second areas 27 and 28 may be areas extending in the second direction (for example, the vertical direction) among the areas formed among the plurality of memory blocks 21 to 24. The second areas 27 and 28 may be disposed on a seventh axis. The seventh axis may substantially bisect the third area 29 and the second areas 27 and 28. The seventh axis may be substantially perpendicular to the first axis.

In the second areas 27 and 28, the circuit configurations related to the column decoding operation and the column control may be arranged.

The third area 29 may be an area where the first areas 25 and 26 intersect with the second areas 27 and 28. In other words, the first and seventh axis may intersect in the third area 29. Further, the first areas 25 and 26 and the second areas 27 and 28 may extend to meet and/or intersect in the third area 29. Still further, the third area 29 may be disposed such that two sides of the third area 29 may be substantially aligned with two sides of the second areas 27 and 28. Also, two sides of the third area 29 may be substantially aligned with two sides of the first areas 25 and 26.

In the third area 29, circuit configurations related to operation timing control of sense amplifiers included in the plurality of memory blocks 21 to 24 may be arranged.

The intersection area 50 may be shared by the first memory bank 10 and the second memory bank 20. Further, the first axis may bisect the intersection area 50.

In the intersection area 50, circuit configurations related to row address control may be arranged.

Furthermore, in the intersection area 50, a test mode logic and a fuse block associated with the test mode logic may be arranged.

Figure 2:
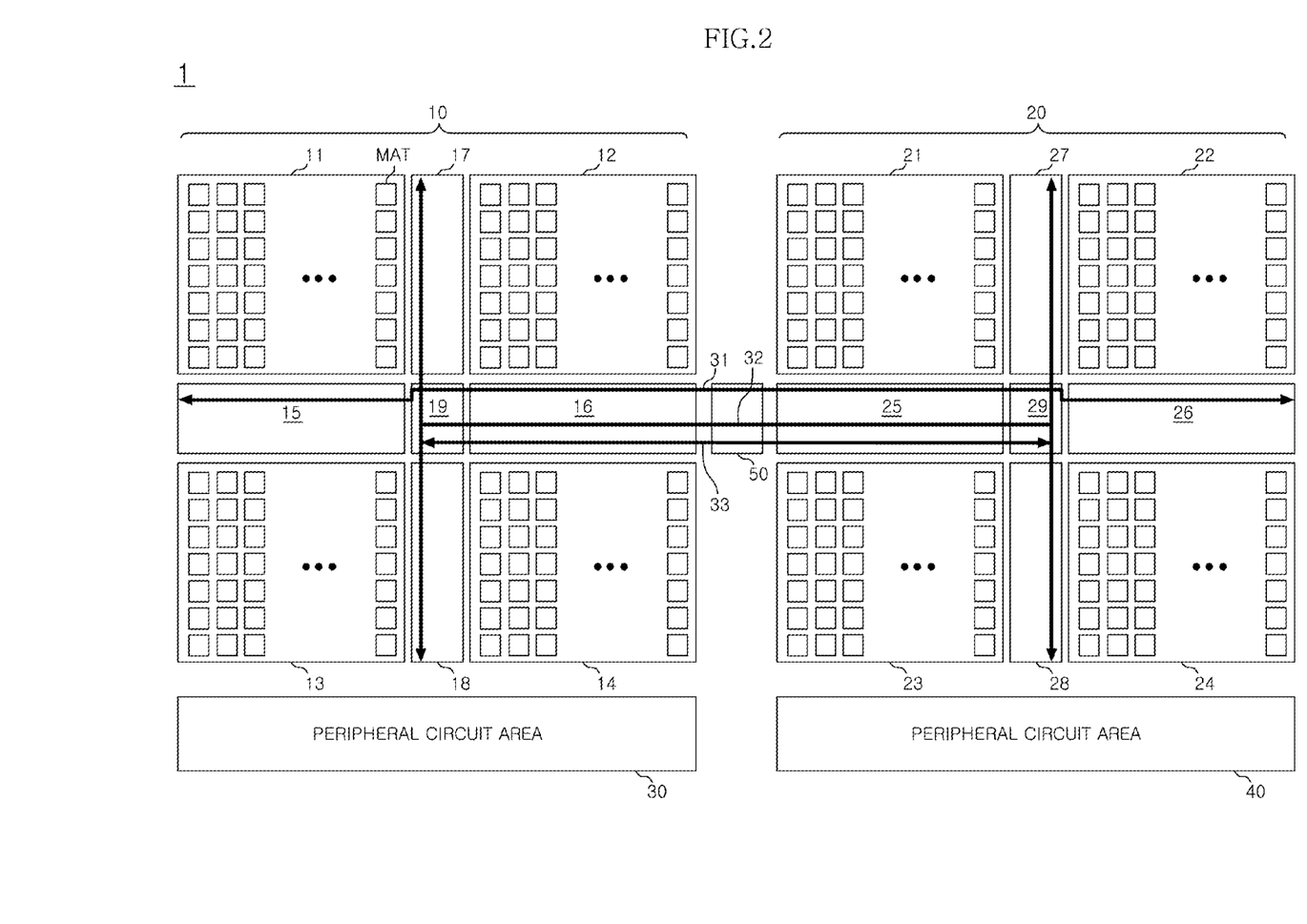
FIG. 2 is a layout diagram for showing an arrangement of signal lines of FIG. 1.

Turning now to FIG. 2. FIG. 2 show a plan view of a layout diagram for showing an arrangement of signal lines of FIG. 1. As illustrated in FIG. 2, signal lines 31 and 32 for row and column control may be arranged from the intersection area 50 to circuits related to the column decoding operations of the second areas 17 and 18 via the first areas 15 and 16 and the third area 19 of the first memory bank 10.

Furthermore, test signal lines 33 coupled with the test mode logic of the intersection area 50 may be communicated through the signal lines to the second areas 17 and 18 via the first areas 15 and 16 and the third area 19 of the first memory bank 10.

The signal lines 31 and 32 for column and row control may also be arranged from the intersection area 50 to circuits related to the column decoding operations of the second areas 27 and 28 via the first areas 25 and 26 and the third area 29 of the second memory bank 20.

Furthermore, the test signal lines 33 coupled with the test mode logic may be may be communicated through the signal lines to the second areas 27 and 28 via the first areas 25 and 26 and the third area 29 of the second memory bank 20.

Figure 3:
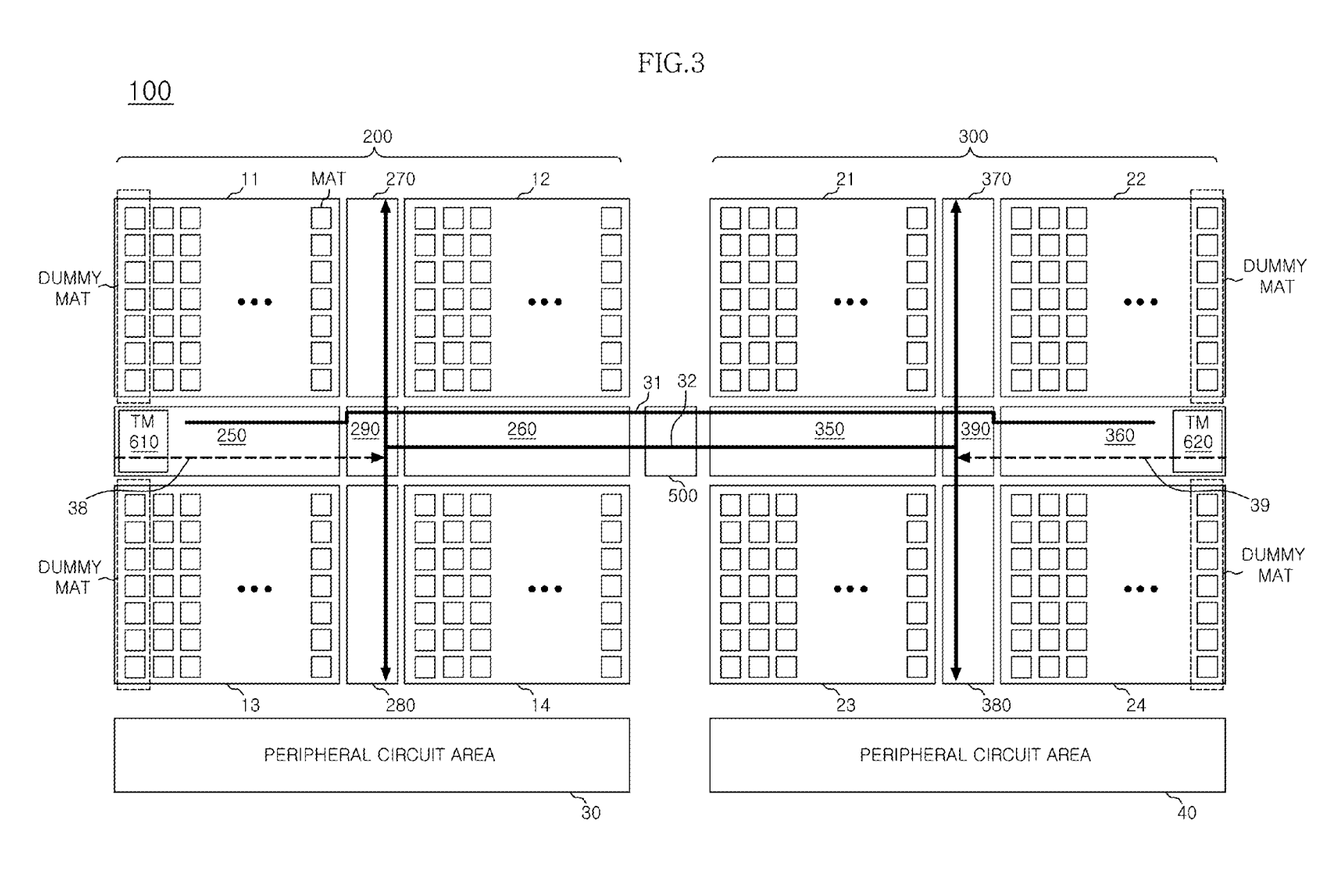
FIG. 3 is a layout diagram of a semiconductor apparatus 100 according to another embodiment.

As illustrated in the plan view of FIG. 3, in a semiconductor apparatus 100 according to another embodiment, peripheral circuit areas 30 and 40 are arranged with respect to a first memory bank 200 and a second memory bank 300, respectively.

An intersection area 500 is arranged between the first memory bank 200 and the second memory bank 300.

The first memory bank 200 may include a plurality of memory blocks 11 to 14, first areas 250 and 260, second areas 270 and 280, and a third area 290. The memory blocks 11 to 14 may comprise a first memory block 11, a second memory block 12, a third memory block 13 and a fourth memory block 14.

Each of the plurality of memory blocks 11 to 14 may include a plurality of unit memory blocks, that is, a plurality of mats MAT.

The first areas 250 and 260 may be areas extending in a first direction (for example, a horizontal direction) among areas formed among the plurality of memory blocks 11 to 14. The first areas 250 and 260 may be disposed along a first axis which may substantially bisect the third area 290 and the first areas 250 and 260. Further, the first area 250 may be disposed on a second axis which substantially bisects the first area 250 and first and third memory blocks 11 and 13. Also, the first area 260 may be disposed on a third axis which substantially bisects the first area 260 and the second and fourth memory blocks 12 and 14. The second and third axis may be substantially parallel. The second and third axis may be substantially perpendicular to the first axis.

In the first areas 250 and 260, signal lines 31 and 32 for column and row control may be arranged.

Furthermore, in the first areas 250 and 260, particularly, at an edge part of the first area 250, a test mode logic and a fuse block (TM) 610 associated with the test mode logic may be arranged. In one example, a test mode-related circuit included in the first areas 250 and 260 may include the test mode logic and a fuse block 610.

In one embodiment, the test mode logic and fuse 610 may be disposed on an edge of the first area 250 that is furthest away from the intersection area.

Each of the plurality of memory blocks 11 to 14 may include dummy mats according to structural characteristics (for example, a 6F2 structure).

The dummy mat is a configuration in which data is not stored. Since a corresponding circuit configuration is not required, an area on the same line between the first areas 250 and 260, that is, the edge part of the first area 250 may be a spare space in which no circuit configuration exists.

Accordingly, the test mode logic and the fuse block 610 associated with the test mode logic may be arranged at the edge part of the first area 250. And, in one example, the first area 260 does not include the test mode logic and the fuse block.

The second areas 270 and 280 may be areas extending in a second direction (for example, a vertical direction) among the areas formed among the plurality of memory blocks 11 to 14. The second areas 270 and 280 may be disposed on a fourth axis. The fourth axis may substantially bisect the third area 290 and the second areas 270 and 280. The fourth axis may be substantially perpendicular to the first axis.

In the second areas 270 and 280, circuit configurations related to a column decoding operation and column control may be arranged.

The third area 290 may be an area where the first areas 250 and 260 intersect with the second areas 270 and 280. In other words, the first and fourth axis may intersect in the third area 290. Further, the first areas 250 and 260 may extend to meet and/or intersect in the third area 19. Also, the second areas 270 and 280 may extend to meet and/or intersect in the third area 290. Still further, the third area 290 may be disposed such that two sides of the third area 290 may be substantially aligned with two sides of the second areas 270 and 280. Also, two sides of the third area 290 may be substantially aligned with two sides of the first areas 250 and 260.

In the third area 290, circuit configurations related to operation timing control of sense amplifiers included in the plurality of memory blocks 11 to 14 may be arranged.

The second memory bank 300 may include a plurality of memory blocks 21 to 24, first areas 350 and 360, second areas 370 and 380, and a third area 390. The memory blocks 21 to 24 may comprise a first memory block 21, a second memory block 22, a third memory block 23 and a fourth memory block 24.

Each of the plurality of memory blocks 21 to 24 may include a plurality of unit memory blocks, that is, a plurality of mats MAT.

The first areas 350 and 360 may be areas extending in the first direction (for example, the horizontal direction) among areas formed among the plurality of memory blocks 21 to 24. The first areas 350 and 360 may be disposed along the first axis which may substantially bisect the third area 390 and the first areas 350 and 360. Further, the first area 350 may be disposed along a fifth axis which substantially bisects the first area 350 and the first and third memory blocks 21 and 23. Also, the first area 360 may be disposed on a sixth axis which substantially bisects the first area 360 and the second and fourth memory blocks 22 and 24. The fifth and sixth axis may be substantially parallel. The fifth and sixth axis may be substantially perpendicular to the first axis.

In the first areas 350 and 360, signal lines 31 and 32 for column and row control may be arranged.

Furthermore, in the first areas 350 and 360, particularly, at an edge part of the first area 360, a test mode logic and a fuse block 620 associated with the test mode logic may be arranged. The test mode logic and a fuse block 620 may be disposed at an edge of the first area 360 that is furthest away from the third area 390.

Each of the plurality of memory blocks 21 to 24 may also include dummy mats according to structural characteristics as described above.

The dummy mat is a configuration in which data is not actually stored. Since a corresponding circuit configuration is not required, an area on the same line between the first areas 350 and 360, that is, the edge part of the first area 360 may be a spare space in which no circuit configuration exists.

Accordingly, the test mode logic and the fuse block 620 associated with the test mode logic may be arranged at the edge part of the first area 360. In one embodiment, the first area 350 does not include a test mode logic and fuse block. The second areas 350 and 360 may be disposed on a seventh axis. The seventh axis may substantially bisect the third area 390 and the second areas 370 and 380. The seventh axis may be substantially perpendicular to the first axis.

The second areas 370 and 380 may be areas extending in the second direction (for example, the vertical direction) among the areas formed among the plurality of memory blocks 21 to 24.

In the second areas 370 and 380, the circuit configurations related to the column decoding operation and the column control may be arranged.

The third area 390 may be an area where the first areas 350 and 360 intersect with the second areas 370 and 380.

In the third area 390, circuit configurations related to operation timing control of sense amplifiers included in the plurality of memory blocks 21 to 24 may be arranged.

The intersection area 500 may be shared by the first memory bank 200 and the second memory bank 300. The first axis may substantially bisect the intersection area 500.

In the intersection area 500, circuit configurations related to row address control may be arranged.

As illustrated in FIG. 3, signal lines 31 for row control may be arranged from the intersection area 500 to first areas 250 and 260, and second areas 270 and 280.

signal lines 32 for column control may be arranged from the intersection area 500 to circuits related to the column decoding operations of the second areas 270 and 280 via the third area 290 and the first area 260 of the first memory bank 200.

Test signal lines 38 coupled with the test mode logic and the fuse block 610 associated with the test mode logic may be communicated to the third area 290 via the first area 250 of the first memory bank 200. The communication of test signals is illustrated with a dashed line 38 extending from the test mode logic and the fuse block 610 to the third area 290.

The signal lines 32 for column control may be arranged from the intersection area 500 to circuits related to the column decoding operations of the second areas 370 and 380 via the third area 390 and the first area 350 of the second memory bank 300.

Furthermore, test signal lines 39 coupled with the test mode logic and the fuse block 620 associated with the test mode logic may be communicated to the third area 390 via the first area 360 of the second memory bank 300. The communication of test signals is illustrated with a dashed line 39 extending from the test mode logic and the fuse block 620 to the third area 390.

As described above, the signal lines 32 for column control are arranged from the intersection area 500 to the third areas 290 and 390 via the first areas 260 and 360 of the first memory bank 200 and the second memory bank 300.

Furthermore, the test signal lines 38 and 39 may be arranged from edge parts of the first memory bank 200 and the second memory bank 300 to the third areas 290 and 390, so that it is possible to efficiently arrange the signal lines.

Figure 4:
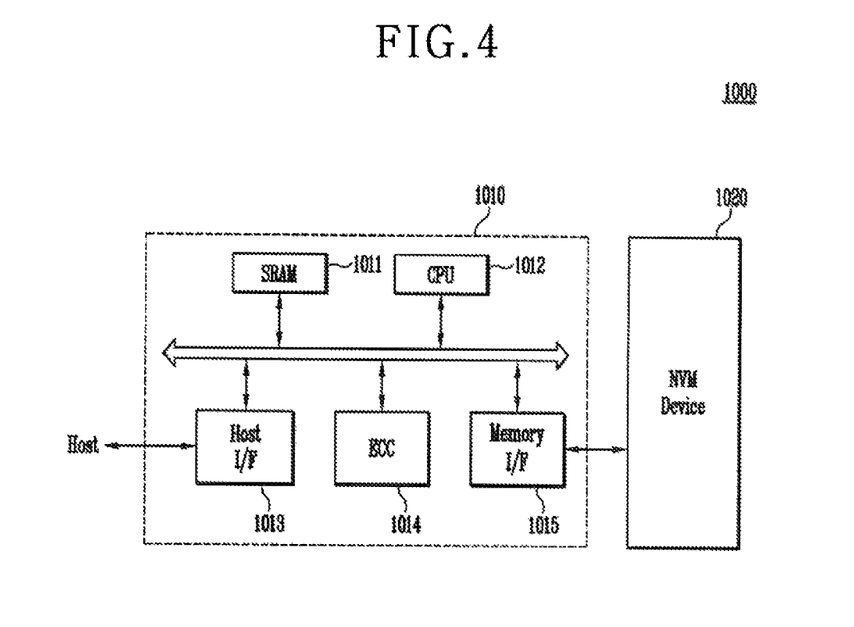
FIG. 4 is a schematic block diagram of a memory system according to an embodiment of the present invention.

Referring to FIG. 4, a memory system 1000 according to an embodiment of the present invention may include a non-volatile memory device 1020 and a memory controller 1010.

The non-volatile memory device 1020 may be configured to include the above-described semiconductor apparatus 1 or 100. The memory controller 1010 may be configured to control the non-volatile memory device 1020 in a general operation mode such as a program loop, a read operation or an erase loop.

The memory system 1000 may be a solid state disk (SSD) or a memory card in which the memory device 1020 and the memory controller 1010 are combined. SRAM 1011 may function as an operation memory of a processing unit (CPU) 1012. A host interface 1013 may include a data exchange protocol of a host being coupled to the memory system 1100. An error correction code (ECC) block 1014 may detect and correct errors included in a data read from the non-volatile memory device 1020. A memory interface (I/F) 1015 may interface with the non-volatile memory device 1120. The CPU 1012 may perform the general control operation for data exchange of the memory controller 1110.

Figure 5:
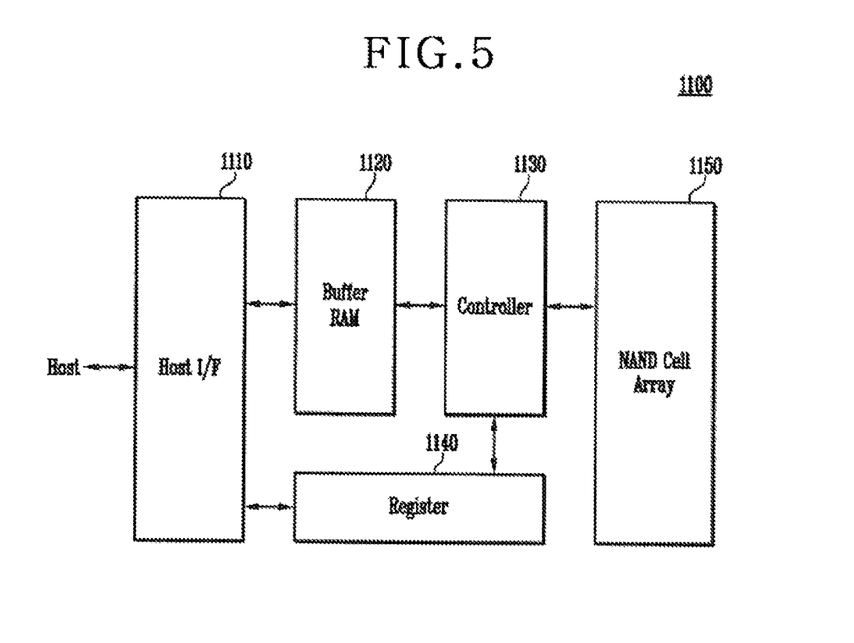
FIG. 5 is a schematic block diagram of a fusion memory device or a fusion memory system configured to perform a program operation according to the aforementioned various embodiments.

Though not illustrated in FIG. 5, the memory system 1100 may further include ROM that stores code data to interface with the host. In addition, the non-volatile memory device 1020 may be a multi-chip package composed of a plurality of flash memory chips. The memory system 1000 may be provided as a storage medium with a low error rate and high reliability. The memory controller 1010 may be configured to communicate with the outside (e.g., a host) through one of the interface protocols including USB, MMC, PCI-E, SATA, PATA, SCSI, ESDI and IDE.

Referring to FIG. 5, a One NAND flash memory device 1100 may include a host interface (I/F) 1110, a buffer RAM 1120, a controller 1130, a register 1140 and a NAND flash cell array 1150. The OneNAND flash memory device 1100 may be used in a fusion memory device.

The host interface 1110 may be configured to exchange various types of information with a device through a different protocol. The buffer RAM 1120 may have built-in codes for driving the memory device or temporarily store data. The controller 1130 may be configured to control read and program operations and every state in response to a control signal and a command that are externally provided. The register 1140 may be configured to store data including instructions, addresses and configurations defining a system operating environment in the memory device. The NAND flash cell array 1150 may be formed of operation circuits including non-volatile memory cells and page buffers. The memory array, as illustrated in FIG. 2, may be used as the memory array of the NAND flash cell array 1150.

Figure 6:
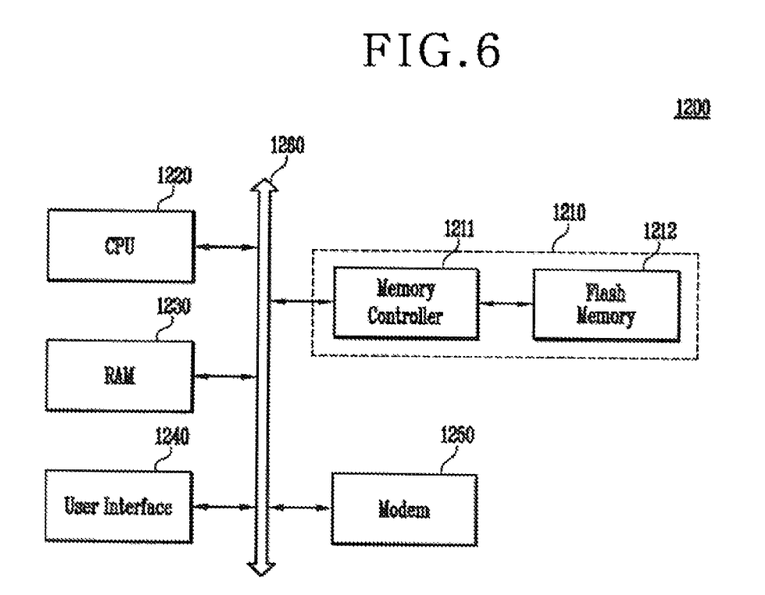
FIG. 6 is a schematic block diagram of a computing system including a flash memory device according to an embodiment of the present invention.

Referring to FIG. 6, a computing system 1200 may include a microprocessor (CPU) 1220, RAM 1230, a user interface 1240, a modem 1250, such as a baseband chipset, and a memory system 1211 that are electrically coupled to a system bus 1260. In addition, if the computing system 1300 is a mobile device, then a battery (not illustrated) may be additionally provided to apply an operating voltage to the computing system 1200. Though not illustrated in FIG. 13, the computing system 1200 may further include application chipsets, a Camera Image Processor (CIS), or mobile DRAM. The memory system 1210 may include a flash memory device 1212 according to the above embodiments, such as, semiconductor apparatus 1 or 100. That is, the memory system 1210 may form a Solid State Drive/Disk (SSD) that uses a non-volatile memory to store data. The memory system 1310 may be provided as a fusion flash memory (e.g., OneNAND flash memory).

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
a memory bank including a plurality of memory blocks;
a first area located in the memory bank, and extending in a first direction among areas formed between the plurality of memory blocks;
a second area located in the memory bank, and extending in a second direction among the areas; and
a test mode-related circuit block arranged at an edge part of the first area.

2. The semiconductor apparatus according to claim 1, wherein a plurality of unit memory blocks of each of the plurality of memory blocks include dummy memory blocks, respectively.

3. The semiconductor apparatus according to claim 2, wherein the test mode-related circuit block is arranged in an area of the first area on the same line as a line of the dummy memory block.

4. The semiconductor apparatus according to claim 1, further comprising:
a third area corresponding to an area where axis of the first area and the second area intersect.

5. The semiconductor apparatus according to claim 4, wherein a signal line electrically coupled to the test mode-related circuit block extends to the third area.

6. The semiconductor apparatus according to claim 1, wherein the test mode-related circuit block includes a test mode logic and a fuse block associated with the test mode logic.

7. A semiconductor apparatus comprising:
a first memory bank;
a second memory bank; and
an intersection area arranged between the first memory bank and the second memory bank,
wherein a test mode-related circuit block is arranged at an edge part of a first area, and
wherein the first area is located in the first memory bank, and extending in a first direction among areas formed between a plurality of memory blocks of the first memory bank.

8. The semiconductor apparatus according to claim 7, wherein a plurality of unit memory blocks of each of the plurality of memory blocks of the first memory bank include dummy memory blocks, respectively.

9. The semiconductor apparatus according to claim 8, wherein the test mode-related circuit block is arranged in an area of the first area on the same line as a line of the dummy memory block.

10. The semiconductor apparatus according to claim 7, further comprising:
a second area extending in a second direction among the areas; and
a third area corresponding to an area where axis of the first area and the second area intersect.

11. The semiconductor apparatus according to claim 10, wherein a signal line electrically coupled to the test mode-related circuit block extends to the third area.

12. The semiconductor apparatus according to claim 10, wherein signal lines for a row and a column control extend from the intersection area to the third area.

13. The semiconductor apparatus according to claim 7, wherein a test mode-related circuit block is arranged at an edge part of a first area extending in a first direction among areas formed between a plurality of memory blocks of the second memory bank.

14. The semiconductor apparatus according to claim 13, wherein the plurality of unit memory blocks of each of the plurality of memory blocks of the second memory bank include dummy memory blocks, respectively.

15. The semiconductor apparatus according to claim 14, wherein the test mode-related circuit block is arranged in an area of the first area on the same line as a line of the dummy memory block.

16. The semiconductor apparatus according to claim 13, further comprising:
   a second area extending in a second direction among the areas; and
   a third area corresponding to an area where axis the first area and the second area intersect with each other.

17. The semiconductor apparatus according to claim 16, wherein a signal line electrically coupled to the test mode-related circuit block extends to the third area.

18. The semiconductor apparatus according to claim 16, wherein signal lines for row and column control extend from the intersection area to the third area.

19. The semiconductor apparatus according to claim 16, wherein at least two sides of the third area may be aligned with two side of the first area, and two sides of the third area may be aligned with two sides of the second area.

20. The semiconductor apparatus according to claim 16, wherein first memory bank includes a first area and a second area disposed on an axis that bisects the intersection area and the first area and second area of the first memory bank, and the second memory bank includes a first area and a second area disposed on the axis such that the axis bisects the intersection area and the first area and second area of the second memory bank.

* * * * *